US012622045B2

(12) United States Patent
Baliga

(10) Patent No.: US 12,622,045 B2
(45) Date of Patent: May 5, 2026

(54) SEMICONDUCTOR POWER DEVICES HAVING DOPED AND SILICIDED POLYSILICON TEMPERATURE SENSORS THEREIN

(71) Applicant: North Carolina State University, Raleigh, NC (US)

(72) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 831 days.

(21) Appl. No.: 17/816,993

(22) Filed: Aug. 2, 2022

(65) Prior Publication Data

US 2023/0011193 A1     Jan. 12, 2023

Related U.S. Application Data

(63) Continuation-in-part of application No. 17/418,309, filed as application No. PCT/US2020/018027 on Feb. 13, 2020, now Pat. No. 12,094,932.

(Continued)

(51) Int. Cl.
*H10D 84/00*        (2025.01)
*G01K 7/18*        (2006.01)

(Continued)

(52) U.S. Cl.
CPC ........... *H10D 84/141* (2025.01); *G01K 7/186* (2013.01); *H10D 12/441* (2025.01);

(Continued)

(58) Field of Classification Search
CPC .. H10D 84/141; H10D 84/811; H10D 84/817; H10D 12/441; H10D 62/105;

(Continued)

(56) References Cited

U.S. PATENT DOCUMENTS

| | | | |
|---|---|---|---|
| 5,396,085 A | 3/1995 | Baliga | |
| 5,801,418 A * | 9/1998 | Ranjan | ................. H10D 84/817 |
| | | | 257/373 |

(Continued)

FOREIGN PATENT DOCUMENTS

| | | | | |
|---|---|---|---|---|
| CN | 102903702 A * | 1/2013 | ........... | H10D 84/141 |
| CN | 105895673 A * | 8/2016 | ............. | H10D 62/80 |

(Continued)

OTHER PUBLICATIONS

Agarwal et al. "Impact of Channel Length on Characteristics of 600V 4H-SiC Inversion-channel Planar MOSFETs" ESSDERC 2019—49th European Solid-State Device Research Conference (ESSDERC) (Sep. 2019).

(Continued)

*Primary Examiner* — Ida M Soward
(74) *Attorney, Agent, or Firm* — Myers Bigel, P.A.

(57) ABSTRACT

A power device includes a semiconductor substrate having first and second current carrying terminals on respective first and second opposing surfaces thereof. A silicided polysilicon temperature sensor and silicided polysilicon gate electrode are provided on the first surface. A source region of first conductivity type and a shielding region of second conductivity type are provided in the semiconductor substrate. The shielding region forms a P-N rectifying junction with the source region, and extends between the silicided polysilicon temperature sensor and the second current carrying terminal. A field oxide insulating region is provided, which extends between the shielding region and the silicided polysilicon temperature sensor.

20 Claims, 7 Drawing Sheets

Related U.S. Application Data

(60) Provisional application No. 63/245,521, filed on Sep. 17, 2021, provisional application No. 62/858,145, filed on Jun. 6, 2019, provisional application No. 62/808,451, filed on Feb. 21, 2019.

(51) Int. Cl.

| | |
|---|---|
| *H10D 12/00* | (2025.01) |
| *H10D 62/10* | (2025.01) |
| *H10D 62/832* | (2025.01) |
| *H10D 64/66* | (2025.01) |

(52) U.S. Cl.
CPC ....... *H10D 62/105* (2025.01); *H10D 62/8325* (2025.01); *H10D 64/663* (2025.01)

(58) Field of Classification Search
CPC ............. H10D 62/8325; H10D 62/157; H10D 62/393; H10D 64/663; H10D 30/662; H10D 1/47; H10D 1/474; G01K 7/186
See application file for complete search history.

(56) References Cited

U.S. PATENT DOCUMENTS

| | | | |
|---|---|---|---|
| 5,912,497 | A | 6/1999 | Baliga |
| 6,649,975 | B2 | 11/2003 | Baliga |
| 6,764,889 | B2 | 7/2004 | Baliga |
| 6,791,143 | B2 | 9/2004 | Baliga |
| 7,041,559 | B2 | 5/2006 | Baliga |
| 9,793,352 | B1 | 10/2017 | Seok et al. |
| 9,905,633 | B1 * | 2/2018 | Yang ................. H01L 21/76816 |
| 12,313,659 | B2 * | 5/2025 | Nagao ................. H10D 30/669 |
| 2003/0183880 | A1 * | 10/2003 | Goto .................... H10D 84/811 |
| | | | 257/379 |
| 2004/0070910 | A1 | 4/2004 | Gergintschew |
| 2004/0188795 | A1 * | 9/2004 | Ohkubo ................. H10D 1/474 |
| | | | 257/467 |
| 2005/0020021 | A1 * | 1/2005 | Fujiwara .............. H10D 84/811 |
| | | | 257/E21.507 |
| 2007/0096183 | A1 * | 5/2007 | Ogawa .................... H10D 1/47 |
| | | | 257/300 |
| 2013/0032824 | A1 * | 2/2013 | Hayashi ................. H10D 84/83 |
| | | | 257/77 |
| 2014/0177285 | A1 | 6/2014 | Disney |
| 2021/0202341 | A1 | 7/2021 | Kim et al. |
| 2022/0085171 | A1 | 3/2022 | Baliga |

FOREIGN PATENT DOCUMENTS

| | | |
|---|---|---|
| EP | 1041634 A1 | 10/2000 |
| EP | 0808027 B1 | 12/2004 |

OTHER PUBLICATIONS

Chang et al. "Resistor-Based Temperature Sensing Chip with Digital Output" 2020 International Symposium on VLSI Design, Automation and Test (VLSI-DAT) (Aug. 2020).

Chuang et al. "Temperature-Dependent Characteristics of Polysilicon and Diffused Resistors" IEEE Trans. Electron Devices 50(5):1413-1415 (May 2003).

Hatta et al. "Suppression of Short-Circuit Current with Embedded Source Resistance in SiC-MOSFET" Materials Science Forum 924:727-730 (2017).

Huang et al. "Design and Fabrication of 3.3kV SiC MOSFETs for Industrial Applications" 29th International Symposium on Power Semiconductor Devices and IC's (2017).

Noborio et al. "Experimental and Theoretical Investigations on Short-Channel Effects in 4H-SiC MOSFETs" IEEE Transactions on Electron Devices 52(9):1954-1962 (Sep. 2005).

\* cited by examiner

SEMICONDUCTOR POWER DEVICES HAVING DOPED AND SILICIDED POLYSILICON TEMPERATURE SENSORS THEREIN

REFERENCE TO PRIORITY APPLICATIONS

This application claims priority to U.S. Provisional Application Ser. No. 63/245,521, filed Sep. 17, 2021, and is a continuation-in-part (CIP) of U.S. application Ser. No. 17/418,309, filed Jun. 25, 2021, the disclosures of which are hereby incorporated herein by reference.

STATEMENT OF GOVERNMENT INTEREST

The present invention was made with United States Government support under Grant No. DE-EE0008345 awarded by the United States Department of Energy's Office of Energy Efficiency and Renewable Energy (DOE/EERE). The United States Government has certain rights in the invention.

FIELD OF THE INVENTION

The present invention relates to semiconductor devices and, more particularly, to power devices having semiconductor-based switches therein that support high currents and high temperature in high power applications.

BACKGROUND OF THE INVENTION

Conventional semiconductor switching devices that are frequently utilized in high power switching applications to control high current loads may include wide bandgap power transistors, such as silicon carbide (SiC) power MOSFETs. As shown by FIGS. 1A-1B, a planar-gate inversion-mode SiC power MOSFET 10$a$ having a P-type gate-controlled active region (P-BASE) and a planar-gate accumulation-mode SiC power MOSFET 10$b$ having an N-type gate-controlled active region (N-BASE) utilize relatively highly doped P+ shielding regions within an N-type substrate containing a vertical N-type voltage-supporting drift region therein. Related power MOSFETs that utilize P+ shielding regions are disclosed in U.S. Pat. Nos. 6,791,143; 7,041,559 to B. Jayant Baliga, the disclosures of which are hereby incorporated herein by reference.

As shown by FIG. 1C, SiC power MOSFETs 10$c$ may also utilize trench-based gate electrodes having vertical sidewalls, which extend adjacent P-type base regions (P-BASE), and bottoms, which extend adjacent P+ shielding regions. Similarly, FIG. 1D illustrates a silicon (Si) trench-gate insulated-gate bipolar transistor (IGBT) for high power applications, which contains a P-type collector region adjacent a bottom surface of a semiconductor substrate. Related power MOSFETs and IGBTs having trench-based gate electrodes are disclosed in U.S. Pat. Nos. 5,912,497, 6,649,975 and 6,764,889 to B. Jayant Baliga, the disclosures of which are hereby incorporated herein by reference. In addition, U.S. Pat. No. 5,396,085 to B. Jayant Baliga, entitled "Silicon Carbide Switching Device with Rectifying-Gate," discloses, among other things, hybrid switching devices having silicon MOSFETs and silicon carbide JFETs (or MESFETs) integrated together as three-terminal hybrid devices.

Silicon Power MOSFET and IGBT:

Many silicon power MOSFETs and IGBTs are manufactured as n-channel devices due to their generally superior electrical performance when compared with p-channel devices. Typically, these n-channel MOS-gated devices are made using heavily n-type doped polysilicon gate electrodes because of better performance compared with p-type polysilicon gate electrodes, as demonstrated in a textbook by B. Jayant Baliga, entitled, "*Fundamentals of Power Semiconductor Devices*", Second Edition, Springer-Science 2019. In particular, Chapter 6 of this textbook demonstrates that the doping concentration of the P-base region of n-channel devices can be larger when using N+ polysilicon compared with P+ polysilicon to achieve the same desired value for the threshold voltage. (See, e.g., FIG. 6.28). Moreover, the larger P-base doping advantageously suppresses reach-through of the electric field, thereby allowing shorter channel lengths, which reduce the on-state resistance.

Silicon Carbide Power MOSFETs:

Silicon carbide power MOSFET products are typically manufactured using n-channel devices due to their much superior performance compared with otherwise equivalent p-channel devices. These SiC n-channel products are typically made using heavily n-type doped polysilicon gate electrodes because of their better performance compared with p-type polysilicon gate electrodes, as demonstrated in a textbook by B. Jayant Baliga, entitled "*Gallium Nitride and Silicon Carbide Power Devices*", World Scientific Publishers 2017. In particular, as demonstrated in Chapter 11 of this textbook, the doping concentration of the P-base region of n-channel devices is larger when using N+ polysilicon compared with P+ polysilicon to achieve the same desired value for threshold voltage. (See, e.g., FIG. 11.10). Advantageously, this larger doping of the P-base suppresses reach-through of the electric field, which allows for shorter channel length and thereby reduces the on-state resistance.

Silicided Gate Electrode Material for Power Devices:

When manufacturing Si and SiC power devices, the polysilicon gate electrode layer is typically deposited using low pressure chemical vapor deposition (LPCVD). As will be understood by those skilled in the art, an n-type dopant, typically phosphorus (P), is added to the gases during deposition to create a heavily doped N+ polysilicon layer. Alternately, the n-type dopant may be ion implanted into the polysilicon layer to create the heavily doped N+ polysilicon layer. The sheet resistance of N+ polysilicon formed in this manner is typically in a range from 10-20 Ω/sq.

It is advantageous to reduce the resistance of the gate electrode in a power device in order to produce faster switching capability. This is because a smaller gate resistance spreads an applied gate signal across a chip more rapidly, which allows for more uniform current flow and faster current transients during switching. This is also important for allowing these power devices to operate at higher frequencies. One conventional approach to reduce the gate electrode resistance is to include aluminum metal bus-bars for the gate electrode in selected portions of the chip. Unfortunately, these bus-bars typically occupy valuable area on the chip resulting in an increase in the device on-resistance. Manufacturers also prefer to reduce the resistance of the gate electrode by adding a silicide layer on top of the N+ polysilicon layer. This silicide layer is typically produced by depositing a metal, such as Tungsten (W), followed by rapid-thermal annealing (RTA) at about 900° C. to thereby form tungsten-silicide by reaction with the underlying polysilicon. A silicided polysilicon gate electrode formed in this manner may have a low sheet resistance of about 3 Ω/sq, an improvement by a factor of 3-7 times compared with N+ polysilicon. This siliciding of polysilicon is usually performed immediately after deposition of the N+ polysilicon. The silicided polysilicon can then be patterned using a gate electrode shaping mask in the same manner as non-silicided polysilicon gate electrodes. This sequence avoids having to align the silicide layer to a patterned polysilicon layer using an additional masking step.

Silicon Power MOSFET and IGBT Fabrication:

A conventional fabrication process for silicon power MOSFETs and IGBTs is discussed in a textbook by B. Jayant Baliga, entitled "*Fundamentals of Power Semiconductor Devices*", Second Edition, Springer-Science 2019. FIG. 6.137 of this textbook illustrates the following fabrication process sequence. For silicon devices, a deep P+ region is formed using a thick field oxide as an implant mask. Then, after growth of a gate insulator (e.g., oxide), the polysilicon gate electrode is deposited, silicided, and patterned. The P-base region and N+ source regions are self-aligned to the silicided polysilicon gate to thereby control the channel length by adjusting the diffusion of the p-type and n-type dopants. The silicided polysilicon gate electrode material is also typically deposited on top of the field oxide during this process, in addition to the active area of the device where the channel is formed; however, this portion of the silicided polysilicon is then removed.

Silicon Carbide Power MOSFET Fabrication:

The basic fabrication process for silicon carbide power MOSFET products is discussed in an ESSDERC 2019 conference paper by A. Aditi and B. J. Baliga, entitled "*Impact of Channel Length on Characteristics of 600V 4H-SiC Inversion- channel Planar MOSFETs*". As highlighted in this paper, all the ion-implanted layers are formed first for silicon carbide devices, followed by a very high temperature anneal at 1650° C. with a carbon cap. A thick field oxide layer is then formed. The active area is opened using a mask. After growth of a gate oxide, a polysilicon gate electrode is deposited, silicided, and patterned. The silicided polysilicon gate electrode material is deposited on top of the field oxide during this process in addition to the active area of the device where the channel is formed; however, this portion of the silicided polysilicon is then removed.

A fabrication process for wide bandgap semiconductor switching devices is also disclosed in U.S. Patent Publ. No. 2021/0202341 to Kim et al., entitled "Wide Bandgap Semiconductor Device with Sensor Element". In particular, Kim et al. discloses the silicidation of polysilicon, which is used as a gate contact, in order to decrease resistance and thus improve distribution of gate signals throughout a semiconductor die to improve switching speed and other performance characteristics. Nonetheless, because Kim et al. asserts that the metallization or silicidation of polysilicon would preclude the formation of sensing elements therein, an additional, non-silicided, polysilicon layer(s) is proposed to enable the formation of the sensing elements (e.g., sensor diodes) therein.

The use of non-silicided N+ and P+ polysilicon resistors (having different temperature coefficients) within a resistor-based temperature sensing bridge is also disclosed at FIG. 2 of an article by Chang et al., entitled "*Resistor-Based Temperature Sensing Chip with Digital Output,*" 2020 International Symposium on VLSI Design, Automation and Test (VLSI-DAT), August (2020). One example of the different temperature coefficients associated with N+ and P+ polysilicon resistors is disclosed in an article by Chuang et al., entitled "*Temperature-Dependent Characteristics of Polysilicon and Diffused Resistors*", IEEE Trans. Electron Devices, Vol. 50, pp. 1413-1415 (2003). In particular, FIG. 1 of Chuang et al. illustrates a strong reduction in resistance with increasing temperature for an N+ polysilicon resistor having a temperature coefficient of –0.176%/° C.

SUMMARY OF THE INVENTION

Power semiconductor devices according to some embodiments of the invention include a semiconductor substrate having first and second current carrying terminals on respective first and second opposing surfaces thereof, a silicided polysilicon gate electrode on the first surface, and a silicided polysilicon temperature sensor, which may extend adjacent the first surface. These power semiconductor devices may be selected from a group consisting of silicon (Si) and silicon carbide (SiC) power MOSFETs, and silicon (Si) and silicon carbide (SiC) IGBTs; however, other power semiconductor devices such as gallium nitride (GaN) HEMT devices and MOS-gate control thyristors (e.g., MCTs, ESTs, BRTs), etc., may also benefit from the inclusion of silicided polysilicon temperature sensors therein.

According to some of these embodiments, a source region of first conductivity type (e.g., N-type) and a shielding region of second conductivity type (e.g., P-type) may be provided within the semiconductor substrate, and adjacent the first surface. In some further embodiments, this shielding region may be configured to extend between the silicided polysilicon temperature sensor and the second current carrying terminal, and may form a P-N rectifying junction with the source region. A field oxide insulating region may also be provided, which extends between the shielding region and the silicided polysilicon temperature sensor.

According to further embodiments of the invention, the silicided polysilicon temperature sensor is configured so that: (i) its resistivity monotonically increases in a range from 25° C. to 125° C. (and possibly across a range from –50° C. to 250° C.), and (ii) its resistance is in a range from 1 $\Omega$/square to 5 $\Omega$/square at 25° C. In particular, the silicided polysilicon temperature sensor may be configured so that its resistivity increases at a rate within a range from 0.075%/° C. to 0.175%/° C., throughout the range from 25° C. to 125° C. A length of the silicided polysilicon temperature sensor may also be in a range from 5 squares to 500 squares, but is more typically in a range from 10 squares to 50 squares to minimize layout requirements.

According to further embodiments of the invention, the first and second current carrying terminals of a power semiconductor device are respective source and drain terminals of a vertical insulated-gate field effect transistor (e.g., MOSFET), and a first terminal of the silicided polysilicon temperature sensor is independent of, or electrically coupled to, the source terminal. In addition, in the event the first and second current carrying terminals are respective emitter and collector terminals of an insulated-gate bipolar transistor (IGBT), a first terminal of the silicided polysilicon temperature sensor may be independent of, or electrically coupled to, the emitter terminal.

According to additional embodiments of the invention, a silicon carbide (SiC) bi-directional field effect transistor (BiDFET) is provided, which includes a third current carrying terminal on the first surface of the semiconductor substrate, and a second silicided polysilicon temperature sensor. In addition, first and second terminals of the second silicided polysilicon temperature sensor may be independent of the first, second and third current carrying terminals, in some embodiments.

A power semiconductor device according to further embodiments of the invention includes a silicon carbide (SiC) substrate having a first source electrode of a first MOSFET and a second source electrode of a second MOS-FET at spaced-apart locations on a first surface thereof. In some of these embodiments, the first and second MOSFETs may be configured as respective JBSFETs. First and second silicided polysilicon temperature sensors are also provided, which are associated with the first and second MOSFETs, respectively, and extend on the first surface. In some of these embodiments, the first and second terminals of each of the first and second silicided polysilicon temperature sensors are independent of the first and second source electrodes; how-ever, in other embodiments, a first terminal of the first silicided polysilicon temperature sensor is electrically con-nected to the first source electrode, and a first terminal of the second silicided polysilicon temperature sensor is electri-cally connected to the second source electrode. Moreover, in the event a first gate electrode of the first MOSFET includes silicided polysilicon derived from a silicided polysilicon layer, then the first and second silicided polysilicon tem-perature sensors may also be derived from the same silicided polysilicon layer.

According to another embodiment of the invention, a power semiconductor device is provided, which includes a semiconductor substrate having an insulated-gate bipolar transistor (IGBT) therein, and a silicided polysilicon tem-perature sensor on a surface thereof. The silicided polysili-con temperature sensor may have a first current carrying terminal electrically coupled to an emitter terminal of the IGBT. In addition, a gate electrode of the IGBT may include silicided polysilicon, which is derived from a silicided polysilicon layer, and the silicided polysilicon temperature sensor may be derived from the same silicided polysilicon layer.

According to another embodiment of the invention, a power semiconductor device may include: (i) a semicon-ductor substrate, (ii) a silicided polysilicon gate electrode on a surface of the substrate, and (iii) a silicided polysilicon temperature sensor. In some of these embodiments, the gate electrode is derived from a silicided polysilicon layer, and the silicided polysilicon temperature sensor is derived from the same silicided polysilicon layer.

DETAILED DESCRIPTION OF EMBODIMENTS

Figures 1A, 1B:
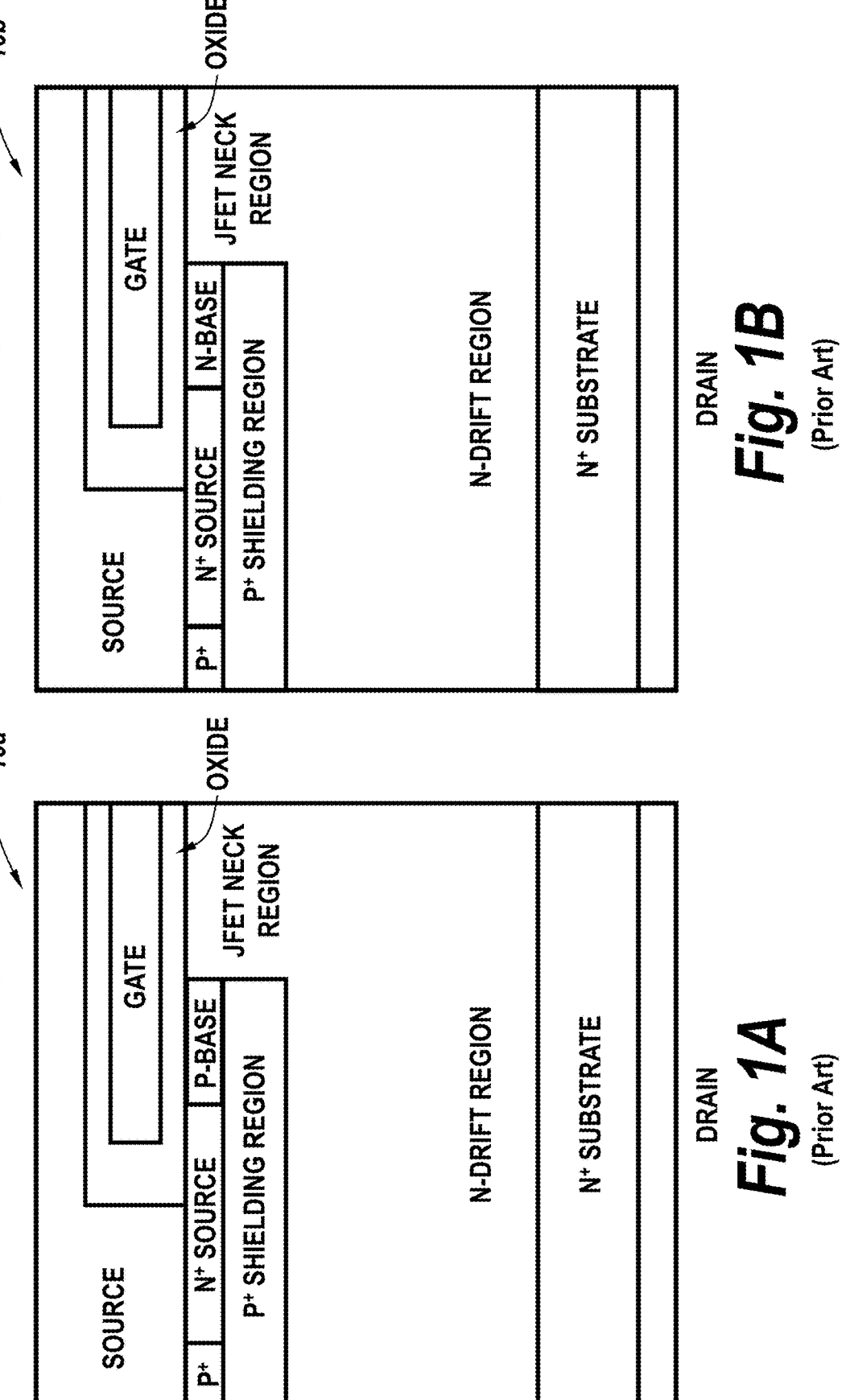
FIG. 1A is a cross-sectional view of a planar-gate MOS-FET having an inversion-mode active region, according to the prior art.
FIG. 1B is a cross-sectional view of a planar-gate MOS-FET having an accumulation-mode active region, according to the prior art.
Figures 1C, 1D:
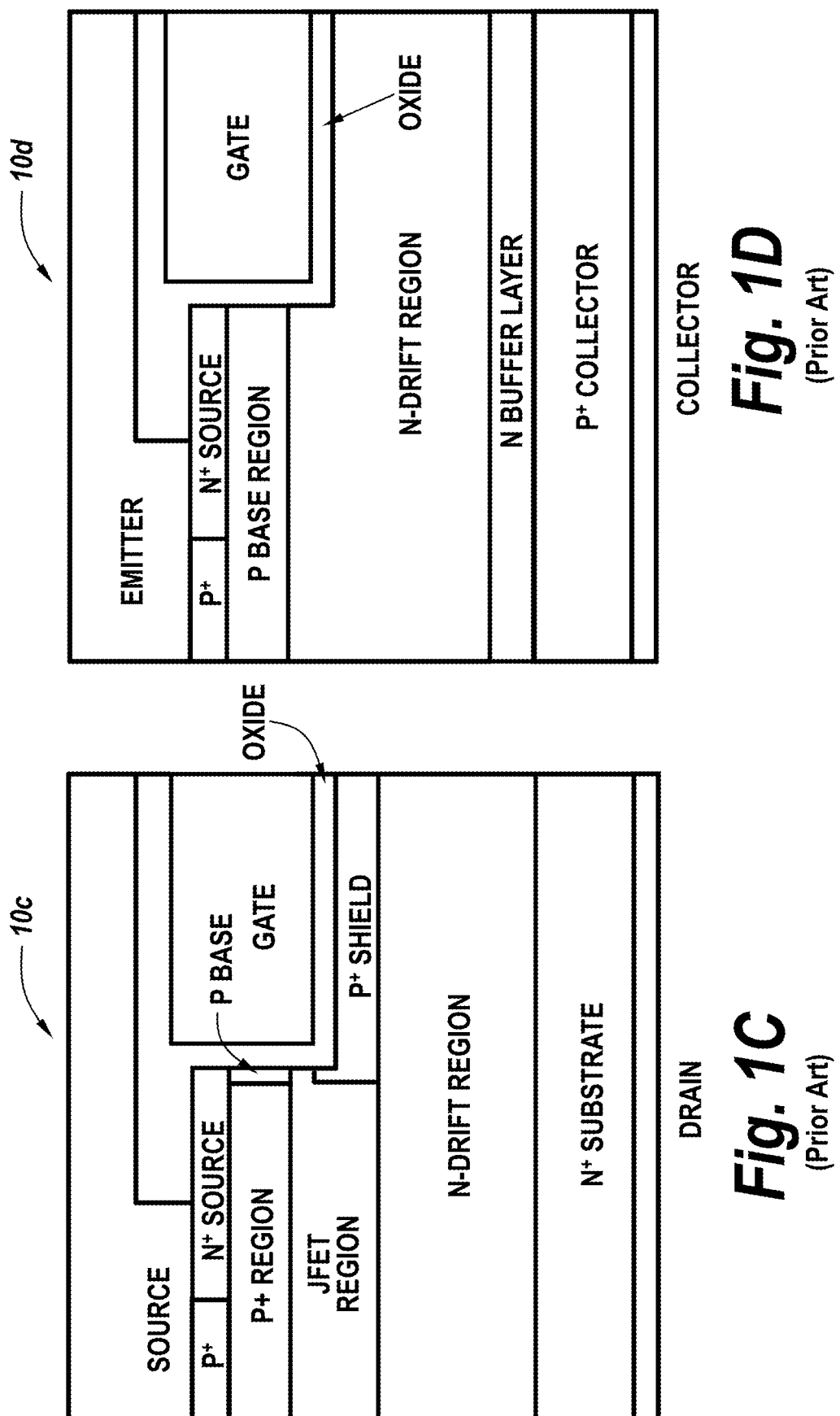
FIG. 1C is a cross-sectional view of a trench-gate MOS-FET having a vertical inversion-mode active region, accord-ing to the prior art.
FIG. 1D is a cross-sectional view of a trench-gate silicon (Si) insulated-gate bipolar transistor (IGBT), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and com-plete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distin-guish one element, component, region, layer or section from another region, layer or section. Thus, a first element, component, region, layer or section discussed below could be termed a second element, component, region, layer or section without departing from the teachings of the present invention.

The terminology used herein is for the purpose of describ-ing particular embodiments only and is not intended to be limiting of the present invention. As used herein, the sin-gular forms "a," "an" and "the" are intended to include the plural forms as well, unless the context dearly indicates otherwise. It will be further understood that the terms "comprising", "including", "having" and variants thereof, when used in this specification, specify the presence of stated features, steps, operations, elements, and/or compo-nents, but do not preclude the presence or addition of one or more other features, steps, operations, elements, compo-nents, and/or groups thereof. In contrast, the term "consist-ing of" when used in this specification, specifies the stated features, steps, operations, elements, and/or components, and precludes additional features, steps, operations, ele-ments and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
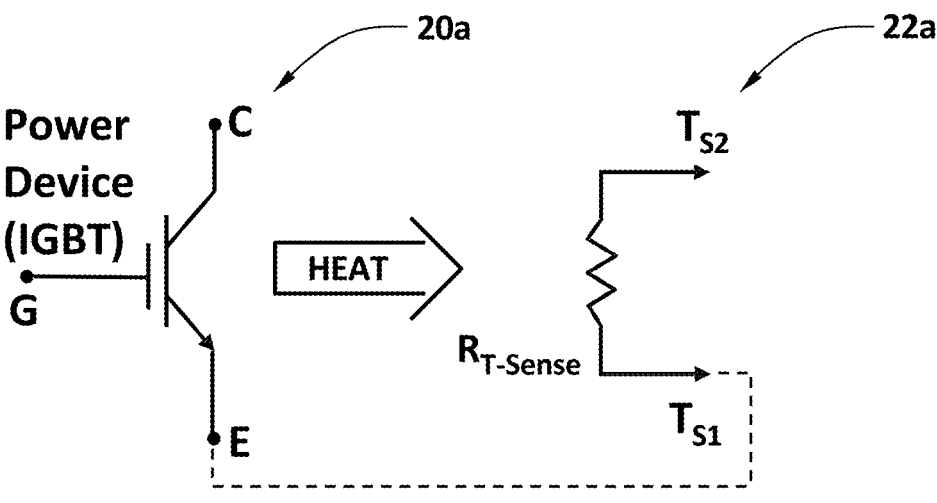
FIG. 2A is a simplified electrical schematic of a high power insulated-gate bipolar transistor (IGBT), which is thermally coupled to a silicided polysilicon temperature sensor, according to an embodiment of the invention.

Referring now to FIG. 2A, a high power semiconductor device according to an embodiment of the invention is illustrated as including an insulated-gate bipolar transistor (IGBT) 20a, which contains a gate (G) terminal, and a pair of current carrying collector (C) and emitter (E) terminals. In some of these embodiments, the IGBT 20a may be configured as a vertical power device, with the current carrying collector terminal C and the current carrying emitter terminal E extending on (or adjacent) opposing surfaces of a semiconductor substrate, such as a silicon (Si) or silicon carbide (SiC) substrate, for example, or other III-V or II-VI semiconductor material substrate. In addition, a silicided polysilicon temperature sensor 22a, which may be configured as a silicided polysilicon resistor ($R_{T\text{-}Sense}$) having two current carrying terminals $T_{S1}$, $T_{S2}$, is provided as integral to the semiconductor device. Advantageously, this resistor $R_{T\text{-}Sense}$ supports enhanced switching control/operation of the IGBT by facilitating real-time temperature measurements during device operation to thereby prevent damage resulting from thermal stress (e.g., overheating). In some embodiments, the resistor $R_{T\text{-}Sense}$ may be configured to be in sufficiently close proximity to the IGBT 20a to receive thermal energy (e.g., heat) therefrom, and enable accurate measurement and/or calculation of an operating temperature within of the IGBT 20a, as explained more fully hereinbelow. In further embodiments, one of the current carrying terminals of the silicided polysilicon resistor $R_{T\text{-}Sense}$ may be directly electrically coupled (optionally shown by a dashed line in FIG. 2A) to a current carrying terminal of the IGBT (e.g., emitter terminal), in order to reduce overall pin count when the power semiconductor device is packaged (and the current carrying terminal of the IGBT is held at a fixed voltage potential (e.g., GND)).

Figure 2B:
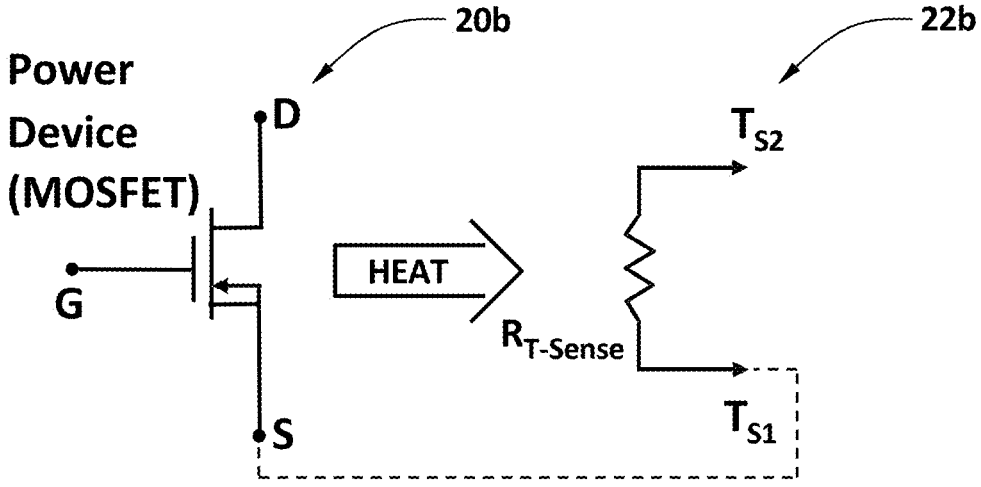
FIG. 2B is a simplified electrical schematic of a high power metal-oxide-semiconductor field effect transistor (MOSFET), which is thermally coupled to a silicided poly-silicon temperature sensor, according to an embodiment of the invention.

Similarly, as illustrated by FIG. 2B, another high power semiconductor device according to an embodiment of the invention is illustrated as including an insulated-gate field effect transistor (e.g., MOSFET) 20b, which contains a gate (G) terminal, and a pair of current carrying drain (D) and source(S) terminals. This MOSFET 20b may be configured as a vertical power device, with the source terminal S and the drain terminal D extending on (or adjacent) opposing surfaces of a semiconductor substrate (e.g., Si, SiC, etc.). A silicided polysilicon temperature sensor 22b, which is shown as a silicided polysilicon resistor ($R_{T\text{-}Sense}$) having two current carrying terminals $T_{S1}$, $T_{S2}$, is provided as integral to the semiconductor device, to support reliable switching and control thereof by preventing thermal malfunction. In some embodiments of the invention, this silicided polysilicon temperature sensor 22b may be formed concurrently with formation of the gate terminal as a silicided polysilicon gate electrode. In addition, the resistor $R_{T\text{-}Sense}$ may be configured to be in sufficiently close proximity to the MOSFET 20b to receive thermal energy (e.g., heat) therefrom. In further embodiments, one of the current carrying terminals of the silicided polysilicon resistor $R_{T\text{-}Sense}$ may be directly electrically coupled (optionally shown by a dashed line in FIG. 2B) to a current carrying terminal of the MOSFET (e.g., source terminal), in order to reduce overall pin count when the power semiconductor device is packaged (and the current carrying terminal of the MOSFET is held at a fixed voltage potential (e.g., GND)).

Figure 3A:
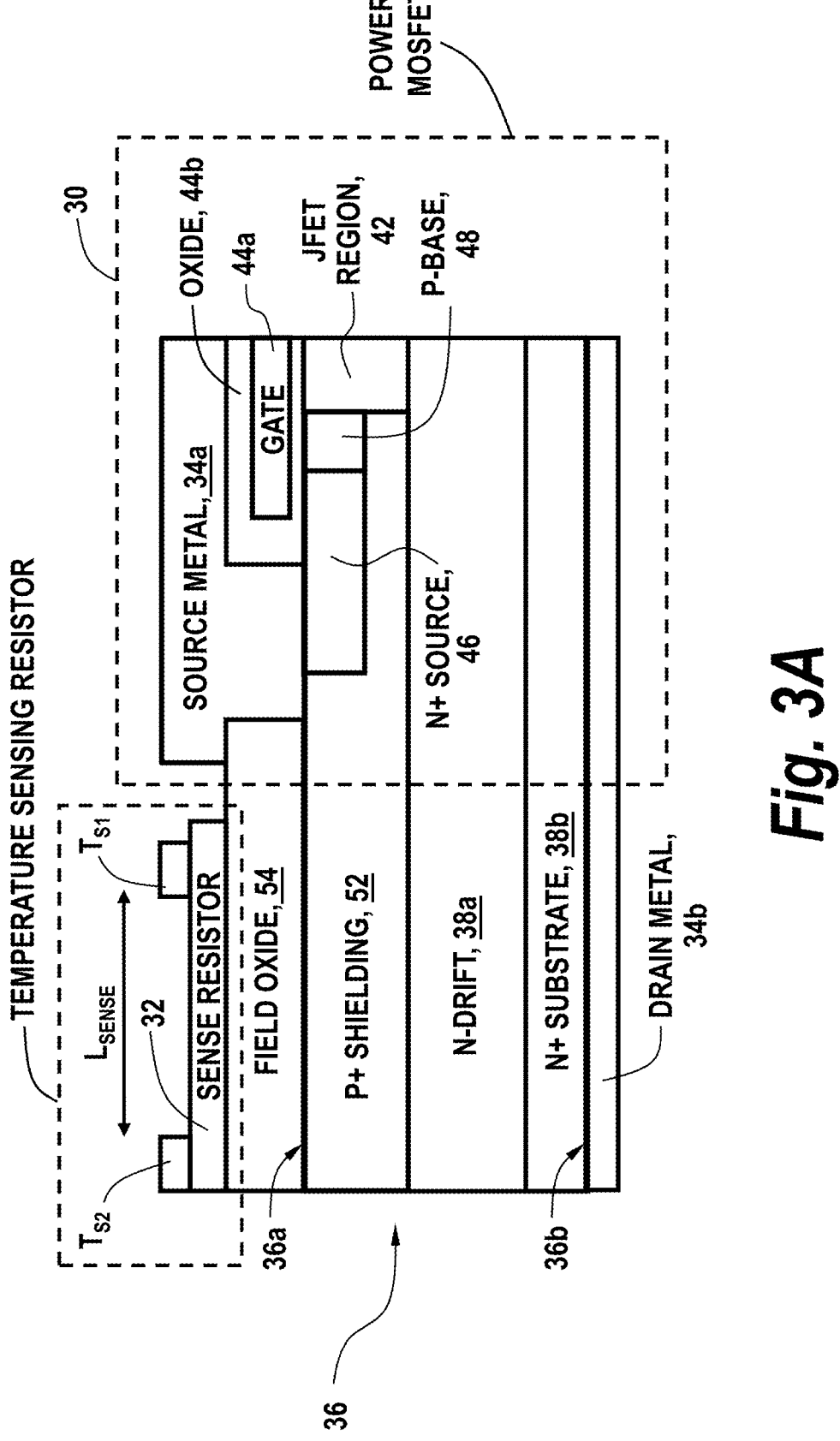
FIG. 3A is a cross-sectional view of a high power MOS-FET half-cell with an adjacent silicided polysilicon tem-perature sensor, according to an embodiment of the inven-tion.

Referring now to FIG. 3A, an embodiment of the high power semiconductor device of FIG. 2B is shown as including a vertical power MOSFET 30 and a silicided polysilicon temperature sensing resistor 32 in close proximity to the MOSFET 30. The MOSFET 30 includes metal source and drain electrodes/terminals 34a, 34b on opposing first and second surfaces 36a, 36b of a semiconductor substrate 36. This semiconductor substrate 36 is shown as including a plurality of semiconductor regions/layers of first conductivity type (e.g., N-type) and second conductivity type (e.g., P-type). In particular, the substrate 36 includes a relatively thick, voltage-supporting, drift region 38a of first conductivity type, which is provided on, and forms a non-rectifying junction with, a highly doped substrate region/layer 38b of first conductivity type that is in ohmic contact with the drain electrode/terminal 34b on the second surface 36b. A JFET neck region 42 of first conductivity type is also provided between the drift region 38a and the first surface 36a. This JFET neck region 42 extends opposite a portion of an insulated gate electrode 44a, 44b (e.g., MOS gate), which extends on the first surface 36a, and is spaced from a source region 46 of first conductivity type by a P-base region 48 of second conductivity type. As will be understood by those skilled in the art, this P-base region 48 supports the formation of an N-type inversion-layer channel therein, in response to the application of a sufficiently positive gate bias to the gate electrode 44a.

As shown, the drift region 38a and JFET neck region 42 form corresponding P-N rectifying junctions with a P+ voltage shielding region 52 of second conductivity type. This P+ shielding region 52 extends to the first surface 36a and forms an ohmic contact with the source electrode/terminal 34a, which is also in direct ohmic contact with the source region 46. These aspects of the vertical MOSFET 30 are further illustrated and described hereinabove with respect to FIG. 1A and the aforementioned U.S. Pat. Nos. 6,791,143 and 7,041,559 to B. Jayant Baliga.

Referring still to FIG. 3A, the silicided polysilicon temperature sensing resistor 32 is provided on the first surface 36a, and is electrically isolated and shielded from the underlying substrate 36 (and drain electrode 34b) by an electrically insulating field oxide isolation region 54 having a thickness in a range from 1000 Å to 10,000 Å. In the illustrated embodiment, the temperature sensing resistor 32 includes two terminals ($T_{S1}$, $T_{S2}$) at opposing ends thereof, which are spaced by a distance equivalent to $L_{sense}$. The first terminal $T_{S1}$ may be provided in direct electrical contact with a source electrode/terminal 34a of the MOSFET 30, and the second terminal $T_{S2}$ may be provided as an independent terminal, which is electrically coupled (e.g., by wire bonding, etc.) to a pin of a package (not shown) containing the MOSFET 30. Thus, the source electrode/terminal 34a of the MOSFET 30 may support a dual-function as: (i) a fixed-voltage (e.g., GND), current carrying, terminal of the MOSFET 30, and (ii) a current carrying terminal of the temperature sensing resistor 32. However, in alternative embodiments, the first terminal $T_{S1}$ may be provided independently as a separate pin when the MOSFET 30 is packaged.

Advantageously, the length, $L_{Sense}$, width, and film thickness of the silicided polysilicon temperature sensing resistor 32 may be defined by photolithographically patterning a blanket polysilicon layer after it has undergone metal silicidation (e.g., of its upper surface), using a conventional metal such as tungsten (W), for example. Moreover, these processing steps may be performed concurrently with the formation of the gate electrode 44a of the MOSFET 30, and without requiring any additional processing and/or masking steps during device fabrication.

Figure 3B:
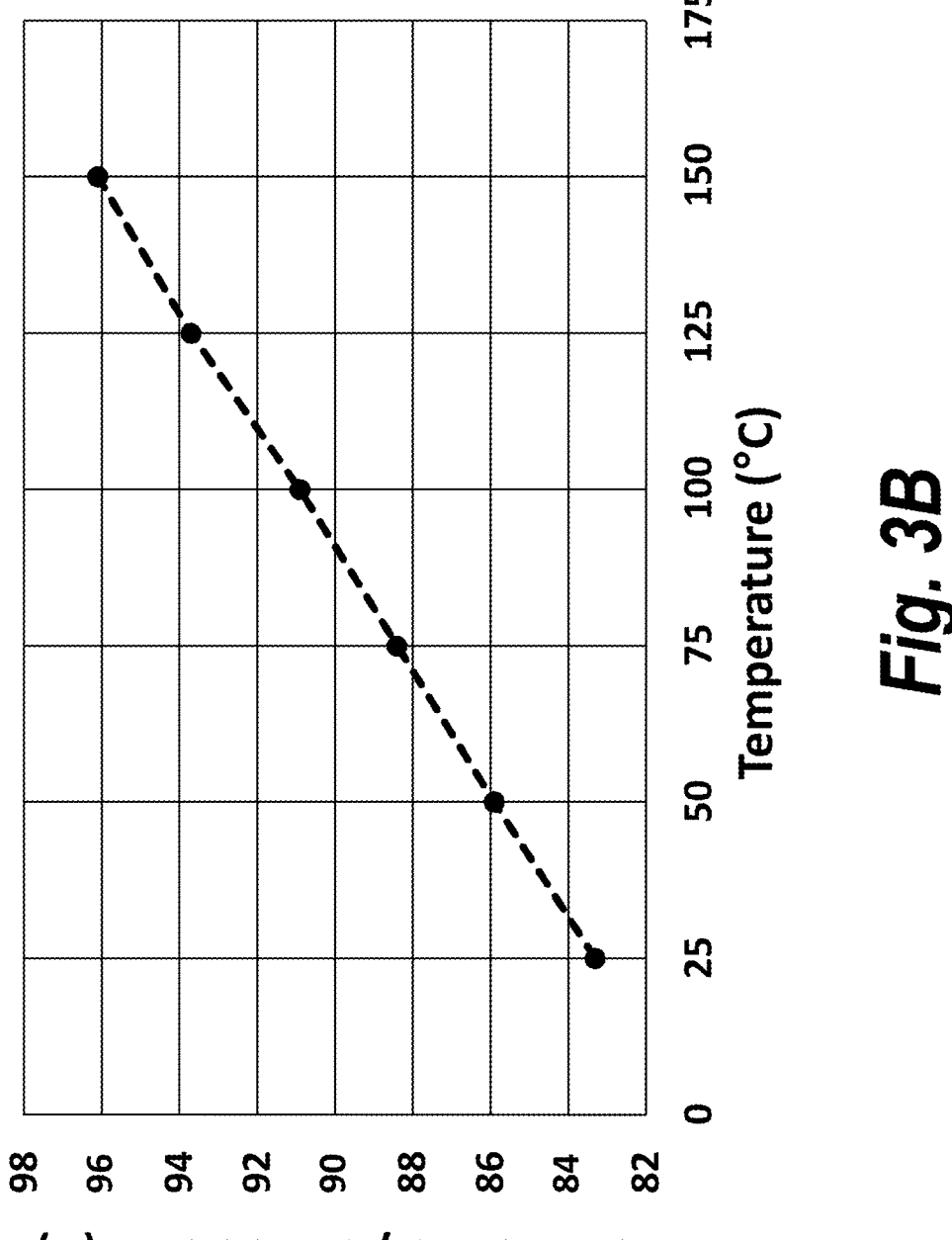
FIG. 3B is a graph illustrating a resistance versus tem-perature characteristic of a silicided polysilicon temperature sensor, according to an embodiment of the invention.

In addition, a resistance of the silicided polysilicon temperature sensing resistor 32, which is based primarily on its length and width, can be easily monitored in-situ (e.g., during active operation) using conventional circuitry (not shown) located outside the package containing the power MOSFET 30, such as disclosed in the aforementioned Chang et al. article. Then, as shown by the monotonically increasing resistance versus temperature graph of FIG. 3B, a continuously measured resistance of the resistor 32 can be readily converted into a reliable measurement of temperature (° C.). This is because the resistor 32 can be sufficiently isolated from the structure of the power MOSFET 30, so its resistance is not materially influenced by the switching of the power MOSFET 30 during operation. As further shown by FIG. 3B, a resistance increase of about 15% over a temperature range from 25° C. to 150° C. (for a resistor having a length of 30 squares) is sufficient for reliable in-situ monitoring.

In particular, according to further embodiments of the invention, the silicided polysilicon temperature sensing resistor 32 may be configured so that: (i) its resistivity monotonically increases in a range from 25° C. to 125° C. (and possibly across a range from −50° C. to 250° C.), and (ii) its resistance is in a range from 1 $\Omega$/square to 5$\Omega$/square at 25° C. In still further embodiments, the silicided polysilicon temperature sensor 32 may be configured so that its resistivity increases at a rate within a range from 0.075%/° C. to 0.175%/° C., throughout the range from 25° C. to 125° C., and a length of the silicided polysilicon temperature sensor 32 may be in a range from 5 squares to 500 squares.

Figures 4A, 4B:
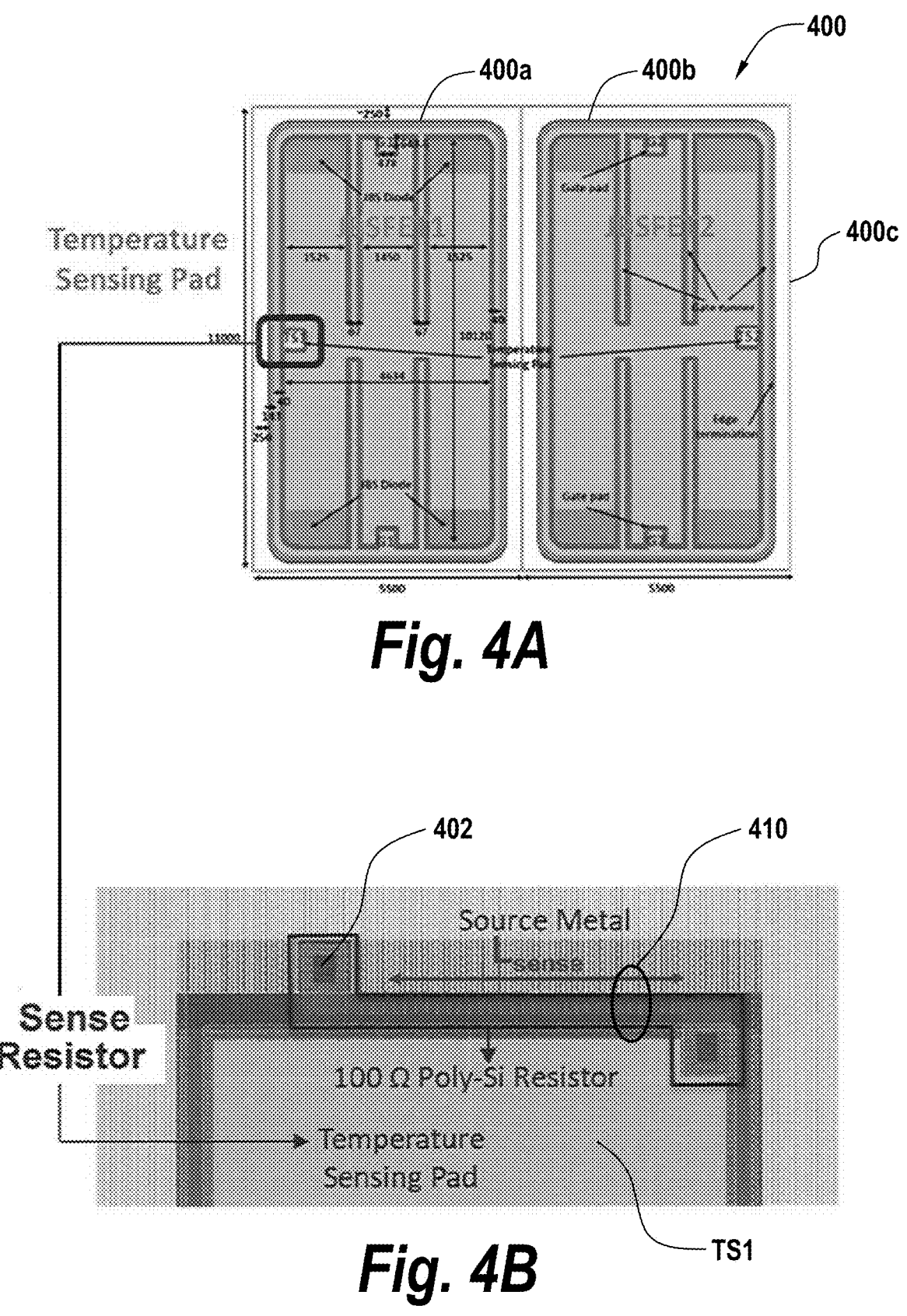
FIG. 4A is a plan layout view of a silicon carbide (SiC) bidirectional field effect transistor (BiDFET), according to an embodiment of the invention.
FIG. 4B is an enlarged view of a highlighted portion of the BiDFET of FIG. 4A, which illustrates a layout configuration of a silicided polysilicon temperature sensor, according to an embodiment of the invention.

Referring now to FIG. 4A, a plan layout view of a multiple unit cell silicon carbide (SiC) bidirectional field effect transistor (BiDFET) 400 is illustrated, which includes a single semiconductor die 400c containing two back-to-back JBSFETs 400a, 400b, which correspond closely to the JBSFET-1 and JBSFET-2 devices within the monolithic bidirectional SiC AC switch of FIG. 5B of the U.S. Pat. No. 10,804,393 to Baliga, the disclosure of which is hereby incorporated herein by reference. However, as shown by FIG. 4A, each of the JBSFETs 400a, 400b includes a respective pair of gate pads G1 (2×) and G2 (2×), and with each gate pad within a pair (G1 or G2) being located on opposing sides of the semiconductor die 400c.

Moreover, each of the JBSFETs 400a, 400b within the BiDFET 400 includes a dedicated temperature sensing pad $T_{S1}$, $T_{S2}$ (see, e.g., $T_{S2}$ in FIG. 3A), which is electrically coupled to a current carrying terminal of a corresponding temperature sensing resistor (see, e.g., resistor 32 in FIG. 3A). Moreover, as highlighted by the enlarged view of FIG. 4B, the first temperature sensing pad $T_{S1}$ of the first JBSFET 400a may be electrically coupled by a nominally 100$\Omega$ silicided polysilicon resistor 410 (e.g., $L_{Sense} \approx 30$ squares) to a corresponding source terminal/metal of the first JBSFET1 400a. Likewise, the second temperature sensing pad $T_{S2}$ may be electrically coupled by a nominally 100$\Omega$ silicided polysilicon resistor (not shown) to a corresponding source terminal/metal 402 of the second JBSFET2 400b (see, e.g., $T_{S1}$ in FIG. 3A). Accordingly, only one additional wire bond and pin is required, per JBSFET, to support temperature monitoring of a packaged BiDFET 400. The use of silicided polysilicon resistors on opposite sides of a packaged BiDFET 400 (i.e., opposite sides of a die) also enables independent temperature measurement of each JBSFET1 400a, JBSFET2 400b; this can be important because the respective on-off duty cycles of the dual-JBSFET devices within the BiDFET 400 may be different, and thereby lead to different thermal stresses within each JBSFET device, which require independent monitoring.

Figure 5:
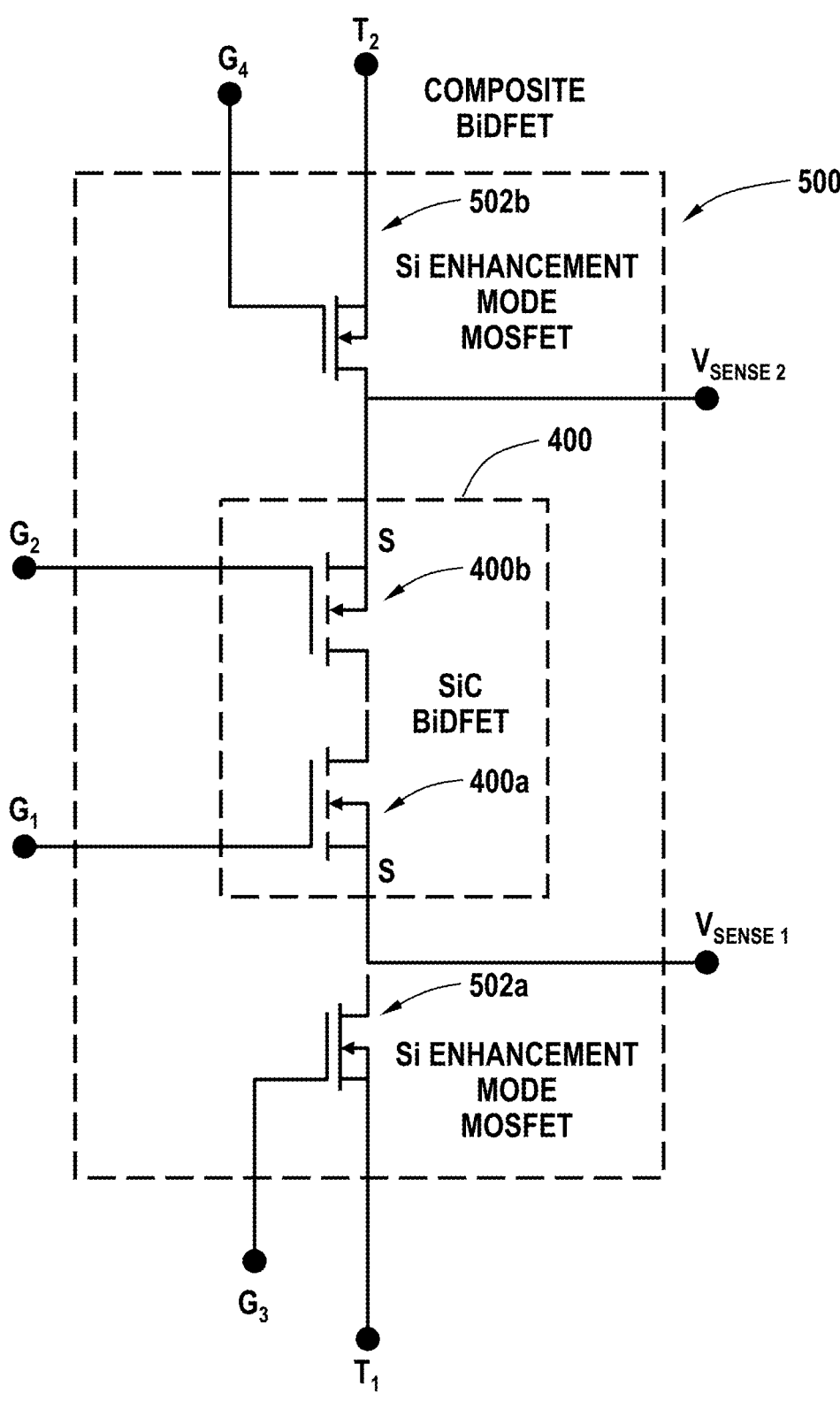
FIG. 5 is an electrical schematic of a SiC/Si Composite BiDFET with short-circuit protection, according to an embodiment of the invention.

Referring now to FIG. 5, a composite, eight-terminal, packaged SiC/Si BiDFET 500 is illustrated, which includes a SiC BiDFET 400, such as disclosed by FIGS. 4A-4B, and a pair of Si enhancement-mode MOSFETs 502a, 502b, which are electrically connected in series with respective source terminals (S) of corresponding JBSFETs 400a, 400b within the SiC BiDFET 400, as shown. The six terminals of the packaged BiDFET 500 include two gate/control terminals ($G_1$, $G_2$), two current carrying terminals ($T_1$, $T_2$), two monitoring terminals ($V_{SENSE1}$, $V_{SENSE2}$), and two user-programmable, DC-voltage, gate terminals ($G_3$, $G_4$).

In addition, each paired and series combination of a Si enhancement-mode MOSFET and SiC MOSFET within the composite BiDFET 500 corresponds to the composite power device 1100a illustrated at FIG. 11A of the aforementioned U.S. application Ser. No. 17/418,309, filed Jun. 25, 2021, which is hereby incorporated herein by reference. As disclosed by the '309 application, each of the Si enhancement-mode MOSFETs 502a, 502b and corresponding monitoring terminals $V_{SENSE1}$, $V_{SENSE2}$ supports short-circuit protection of the composite BiDFET 500, by using the MOSFETs 502a, 502b as saturation current clamps, that improve (i.e., increase) the short-circuit withstand time characteristic of the BiDFET 500; this short-circuit withstand time characteristic may be adjusted by modifying the DC-voltages applied to the gate terminals $G_3$, $G_4$. Moreover, although not shown, a pair of the silicided polysilicon temperature sensors 22b of FIG. 2B may be used within the SiC BiDFET 400, as described hereinabove with respect to FIGS. 4A-4B.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A power semiconductor device, comprising:
   a semiconductor substrate having a first current carrying terminal on a first surface thereof and a second current carrying terminal on a second surface thereof opposing the first surface; and
   a silicided polysilicon temperature sensor on the first surface.

2. The device of claim 1, wherein a first terminal of the silicided polysilicon temperature sensor is electrically connected to the first current carrying terminal.

3. The device of claim 1, further comprising a silicided polysilicon gate electrode on the first surface.

4. The device of claim 1, further comprising:
   a source region of first conductivity type in the semiconductor substrate, which is electrically connected to a first terminal of the silicided polysilicon temperature sensor; and
   a shielding region of second conductivity type in the semiconductor substrate, which extends between the silicided polysilicon temperature sensor and the second current carrying terminal.

5. The device of claim 1, wherein a resistance of the silicided polysilicon temperature sensor monotonically increases with temperature.

6. The device of claim 5, wherein the resistance of the silicided polysilicon temperature sensor is in a range from 1$\Omega$/square to 5$\Omega$/square at 25° C.

7. The device of claim 5, wherein the silicided polysilicon temperature sensor is doped with a dopant of first conductivity type; and wherein the resistance of the silicided polysilicon temperature sensor increases at a rate within a range from 0.075%/° C. to 0.175%/° C. in an operating temperature range.

8. The device of claim 1, wherein the first and second current carrying terminals are source and drain terminals of an insulated-gate field effect transistor (IGFET), respectively.

9. The device of claim 1, wherein the first and second current carrying terminals are respective terminals of an insulated-gate transistor.

10. The device of claim 9, wherein a first terminal of the silicided polysilicon temperature sensor is electrically connected to the first current carrying terminal of the insulated-gate transistor.

11. The device of claim 1, further comprising a third current carrying terminal on the first surface of the semiconductor substrate; and a second silicided polysilicon temperature sensor on the first surface; and wherein the power semiconductor device is a silicon carbide (SiC) bi-directional field effect transistor (BiDFET).

12. The device of claim 11, wherein first and second terminals of the second silicided polysilicon temperature sensor are independent of the first, second and third current carrying terminals.

13. The device of claim 1, wherein the silicided polysilicon temperature sensor comprises a polysilicon layer and a silicide layer on the polysilicon layer.

14. A power semiconductor device, comprising:
a silicon carbide (SiC) substrate having a first source electrode of a first field effect transistor (FET) and a second source electrode of a second FET at spaced-apart locations on a first surface thereof; and
first and second silicided polysilicon temperature sensors associated with the first and second FETS, respectively, on the first surface.

15. The device of claim 14, wherein first and second terminals of each of the first and second silicided polysilicon temperature sensors are independent of the first and second source electrodes.

16. The device of claim 14, wherein a first terminal of the first silicided polysilicon temperature sensor is electrically connected to the first source electrode; and wherein a first terminal of the second silicided polysilicon temperature sensor is electrically connected to the second source electrode.

17. The device of claim 16, wherein a first gate electrode of the first FET comprises silicided polysilicon derived from a silicided polysilicon layer; and wherein the first and second silicided polysilicon temperature sensors are derived from the same silicided polysilicon layer.

18. The device of claim 14, wherein a first gate electrode of the first FET comprises silicided polysilicon derived from a silicided polysilicon layer; and wherein the first and second silicided polysilicon temperature sensors are derived from the same silicided polysilicon layer.

19. A power semiconductor device, comprising:
a semiconductor substrate having an insulated-gate transistor therein; and
a silicided polysilicon temperature sensor having a first current carrying terminal electrically connected to a first current carrying terminal of the insulated-gate transistor.

20. The device of claim 19, wherein a gate electrode of the insulated-gate transistor comprises silicided polysilicon derived from a silicided polysilicon layer; and wherein the silicided polysilicon temperature sensor is derived from the same silicided polysilicon layer.

* * * * *